United States Patent
Mathew et al.

(10) Patent No.: US 6,753,216 B2
(45) Date of Patent: Jun. 22, 2004

(54) MULTIPLE GATE TRANSISTOR EMPLOYING MONOCRYSTALLINE SILICON WALLS

(75) Inventors: Leo Mathew, Austin, TX (US); Bich-Yen Nguyen, Austin, TX (US); Daniel Thanh-Khac Pham, Austin, TX (US); Anne Vandooren, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/285,059

(22) Filed: Oct. 31, 2002

(65) Prior Publication Data

US 2004/0084674 A1 May 6, 2004

(51) Int. Cl.[7] .......................................... H01L 21/8238
(52) U.S. Cl. ...................... 438/199; 438/311; 438/318; 438/479
(58) Field of Search ................................. 257/347, 334, 257/337, 338, 348, 352, 368, 369; 438/149, 151, 153, 195, 199, 310, 311, 301, 318, 479, 517

(56) References Cited

U.S. PATENT DOCUMENTS

| | | | | |
|---|---|---|---|---|
| 4,561,932 A | * | 12/1985 | Gris et al. | 438/410 |
| 4,874,718 A | * | 10/1989 | Inoue | 438/481 |
| 6,365,445 B1 | | 4/2002 | Yu | |
| 6,472,258 B1 | * | 10/2002 | Adkisson et al. | 438/192 |
| 6,525,403 B2 | * | 2/2003 | Inaba et al. | 257/618 |
| 6,562,665 B1 | * | 5/2003 | Yu | 438/149 |

* cited by examiner

*Primary Examiner*—Wael Fahmy
*Assistant Examiner*—Hoai Pham
(74) *Attorney, Agent, or Firm*—Joseph P. Lally (57) ABSTRACT

A semiconductor fabrication process and structure in which a dielectric structure (106) is formed upon a substrate (102). Silicon is then deposited and processed to form a crystalline silicon wall (118) that envelopes the dielectric structure (106) and is physically and electrically isolated from the substrate (102). A gate dielectric film (130) is formed over at least two surfaces of the silicon wall (118) and a gate electrode film (132) is formed over the gate dielectric (130). The gate electrode film (132) is then patterned followed by conventional source/drain implant processing. Portions of the silicon wall (118) disposed on either side of the gate electrode (140) may then be contacted to form source/drain structures (150). In this manner, the portion of the silicon wall (118) covered by the gate electrode (140) comprises a transistor channel region having multiple surfaces controlled by gate electrode (140).

19 Claims, 4 Drawing Sheets

MULTIPLE GATE TRANSISTOR EMPLOYING MONOCRYSTALLINE SILICON WALLS

BACKGROUND OF THE INVENTION

1. Field of the Invention

The present invention relates generally to the field of semiconductor fabrication and, more particularly, to the fabrication of a multiple-gate transistor.

2. Description of Related Art

A conventional metal-oxide-semiconductor (MOS) transistor is typically characterized by a structure in which a gate electrode is displaced above the transistor channel region by an intermediate gate dielectric film. The region below the channel may include the bulk substrate or an epitaxial film. The transistor is operated by applying a bias to the gate electrode. The bulk material is likely grounded or biased to a constant voltage. Thus, the conventional transistor may be described as having a single-sided gate since the gate exists on only one side of the channel.

It is theorized that single-sided gate transistors inherently exhibit operational characteristics, including leakage current, drive current, and sub-threshold slope, that are less than ideal. These parameters are particularly critical in low power applications such as wireless technology. It would therefore be desirable to implement a multiple-gate transistor structure and it would be further desirable if the implemented process employed conventional processing materials, fabrication equipment, and processing steps.

SUMMARY OF THE INVENTION

The problem described above is addressed by a semiconductor fabrication process and the resulting transistor structure described herein. A dielectric structure is formed upon a substrate. Silicon is then deposited and processed to form a substantially monocrystalline silicon wall on one or more sidewalls of the dielectric structure. This silicon wall is then further processed to be isolated from the silicon substrate regions. A gate dielectric film can then be formed on multiple surfaces of the silicon wall and a gate electrode film formed over the gate dielectric. The gate electrode film is then patterned followed by conventional source/drain implant processing. Portions of the silicon wall not covered by the gate electrode film may then be contacted to form source/drain contacts. In this manner, the silicon wall forms or serves as a transistor channel region. Because the gate dielectric and gate electrode film are formed over or adjacent multiple faces of the silicon wall, the resulting transistor has the desired multiple-gate structure. Moreover, the multiple-gate transistor thus formed has a substantially monocrystalline channel region.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Reference will now be made in detail to the presently preferred embodiments of the invention, examples of which are illustrated in the accompanying drawings. It should be noted that the drawings are in simplified form and are not to precise scale. Although the invention herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

Generally speaking, the present invention includes a semiconductor fabrication process and a resulting transistor structure in which a substantially monocrystalline silicon channel structure is formed from deposited silicon. The channel structure preferably extends substantially perpendicularly from the wafer substrate surface to form a silicon wall that serves as the channel for a transistor. A gate dielectric and gate electrode are then formed over or adjacent multiple faces of the silicon wall to produce a transistor gate adjacent multiple sides of a substantially monocrystalline transistor channel region.

Figure 1:
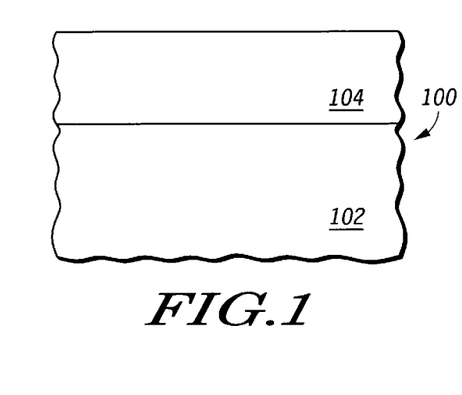
FIG. 1 is a partial cross sectional view of a semiconductor wafer or substrate over which a dielectric has been formed.

Turning now to FIGS. 1 through 23, a semiconductor process and a resulting transistor according to the present invention are illustrated by a series of partial cross-sectional views and top views of a semiconductor wafer at selected stages in the process. In FIG. 1, a dielectric film 104 is formed upon a substrate 102 of a semiconductor wafer 100. An upper portion of substrate 102 preferably includes a monocrystalline silicon region while dielectric film 104 preferably includes silicon-oxide (oxide), silicon-nitride (nitride), or a combination thereof. A thickness of dielectric film 104 is likely in the range of approximately 500 to 1000 angstroms.

Figure 2:
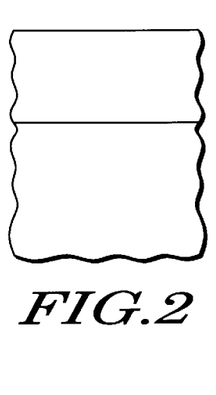
FIGS. 2 through 5 depict various embodiments of the substrate and dielectric of FIG. 1.
Figure 3:
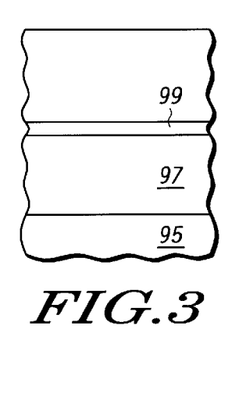
Figure 4:
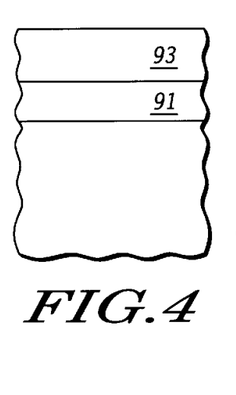
Figure 5:
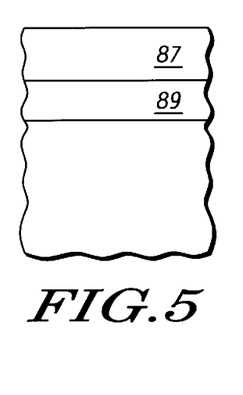

FIGS. 2 through 5 illustrate four suitable embodiments of substrate 102 and dielectric film 104. In FIG. 2, dielectric film 104 includes silicon nitride (nitride) and substrate 102 includes monocrystalline silicon. In FIG. 3, dielectric film 104 again includes a nitride layer, and substrate 102 includes a silicon-on-insulator (SOI) design in which a relatively thin film of monocrystalline silicon 99 is formed over an oxide layer 97 that separates upper silicon film 99 from a bulk silicon 95. In FIG. 4, dielectric film 104 includes a nitride layer 93 disposed over an oxide layer 91 while substrate 102 is a silicon substrate. Finally, in FIG. 5, the oxide and nitride layers of FIG. 3 are flipped to produce a dielectric film in which nitride 89 is disposed between the oxide and the silicon substrate. In any of these embodiments, the oxides may include thermally formed (grown) silicon dioxide, a chemically vapor deposited (CVD) oxide such as low pressure CVD (LPCVD) or plasma enhanced CVD (PECVD) oxides formed from an oxygen bearing source such as $Si(OC_2H_5)_4$ (tetraethyl orthosilicate or TEOS), or an oxide formed from a spin-on glass (SOG). The nitride is preferably LPCVD or PECVD silicon nitride formed from a silicon bearing gas such as silane (SiH4) or dichlorosilane ($SiCl_2H_2$) and a nitrogen bearing gas such as ammonia ($NH_3$) or $N_2$.

Figure 6:
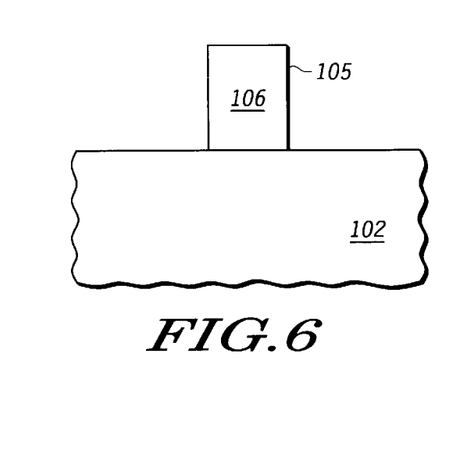
FIG. 6 illustrates optional processing subsequent to FIG. 1 in which the dielectric is patterned to form a dielectric structure.
Figure 7:
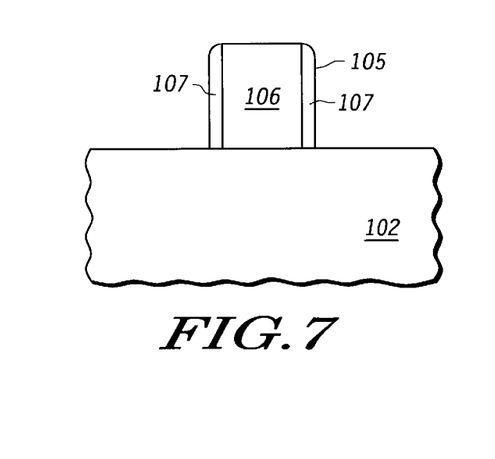
FIG. 7 illustrates optional processing subsequent to FIG. 6 in which a spacer is formed on the dielectric structure.

Referring now to FIG. 6, a conventional lithography and etch sequence is performed following the formation of dielectric film 104 to remove portions of dielectric film 104. The portion of dielectric film 104 remaining after this processing is identified herein as dielectric structure or dielectric structure 106. The etching of dielectric layer 104 may be performed using conventional dry etch processes for nitride and oxide including, for example, a plasma etch using oxygen ($O_2$) and a fluorine bearing compound such as $CHF_3$ or $CF_4$. In embodiments wherein dielectric film 104 includes oxide and nitride, a two-step etch process may be required in which the first process is optimized for etching the oxide and the second process is optimized for etching the nitride (or vice versa).

As depicted in FIG. 6, the perimeter of dielectric structure 106 defines a surface 105 that is substantially perpendicular to an upper surface of substrate 102. In an alternative embodiment depicted in FIG. 7, a spacer structure (referred to herein as a stack spacer) 107 is formed on the sidewalls of dielectric structure 106. In an embodiment where dielectric structure 106 includes silicon nitride, stack spacer 107 is likely to be an oxide spacer formed by depositing an oxide film over dielectric structure 106 and thereafter anisotropically etching the oxide film to create spacers 107 in a manner that will be familiar to those in the field of semiconductor processing. This embodiment might be employed to control the subsequent crystallization of a silicon film as described in greater detail below. In an embodiment employing stack spacers 107, the vertical surface 105 includes the outer surface of stack spacer 107 as shown. In either embodiment, the present invention contemplates the formation of a substantially monocrystalline silicon wall or channel structure upon vertical surface 105 of dielectric structure 106.

Figure 8:
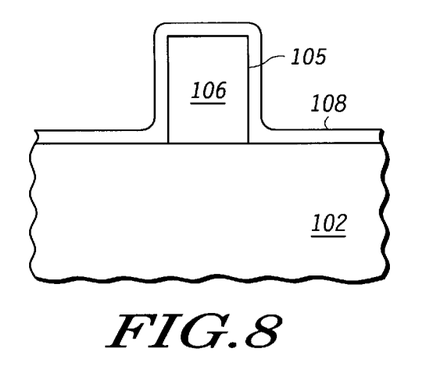
FIG. 8 illustrates processing subsequent to FIG. 6 in which silicon is deposited.

Referring now to FIG. 8, silicon is deposited over wafer 100 to form a silicon film 108 that covers substrate 102 as well as dielectric structure 106. The deposition of silicon film 108 may be accomplished by thermally decomposing silane in a CVD reactor maintained at a temperature between approximately 400 to 680° C. and a pressure of roughly 1 torr or less. Under these deposition conditions, silicon film 108 deposits conformally over dielectric structure 106 and substrate 102 such that thickness of film 108 on sidewalls 105 of dielectric structure 106 is roughly equal to the thickness of film 108 over substrate 102. The thickness of silicon film 108 is preferably in the range of approximately 50 to 500 angstroms. Silicon film 108 may have a polycrystalline or an amorphous structure depending upon the deposition parameters. In the preferred embodiment, the deposition temperature is maintained at a temperature in the range of 400 to 500° C. to produce a silicon film 108 that is substantially amorphous. It is theorized that an amorphous film will facilitate the subsequent crystallization process described below.

Figure 9:
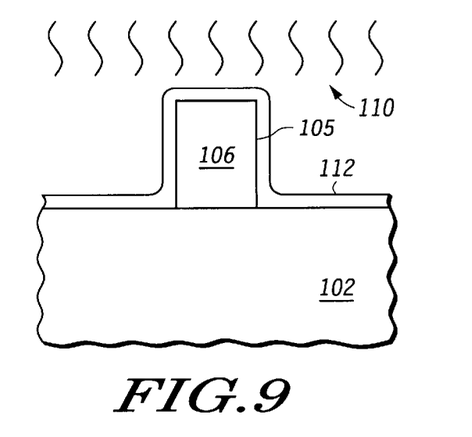
FIG. 9 illustrates processing subsequent to FIG. 8 in which the deposited silicon is crystallized.

In FIG. 9, the wafer is heated in an inert ambient 110 that may include nitrogen, argon, or both maintained at a temperature in the range of 400 to 600° C. to convert silicon film 108 to a substantially monocrystalline film 112. During this process, the monocrystalline silicon of substrate 102 in contact with portions of film 108 serves as a seed layer and provides a starting point for the crystallization of the film. It is theorized that the resulting crystallization of silicon film 108 begins at the portions of film 108 in contact with substrate 102, proceeds up the sidewalls of dielectric structure 106, and converges at the portion of silicon film 108 on top of dielectric structure 104. While lattice imperfections may result where these separate crystalline portions converge on top of dielectric structure 106, the portion of the resulting film over vertical surface 105 of stack 106 is theorized to be substantially monocrystalline. This portion of monocrystalline film 112 will ultimately include the channel portion of a field effect transistor (FET) having gate electrodes disposed on either side of the channel. Providing a substantially monocrystalline silicon channel region for a multiple gate transistor beneficially enhances the operational characteristics of the transistor relative to a transistor employing a polycrystalline or amorphous silicon channel.

The crystallizing of silicon film 108 as described above may be achieved using a conventional thermal source or furnace. Alternatively, a laser anneal or laser assisted process may be employed. In a laser anneal or laser assisted embodiment, a high energy laser beam provides rapid and localized heating of the semiconductor material to form the substantially monocrystalline film 112.

Figure 10:
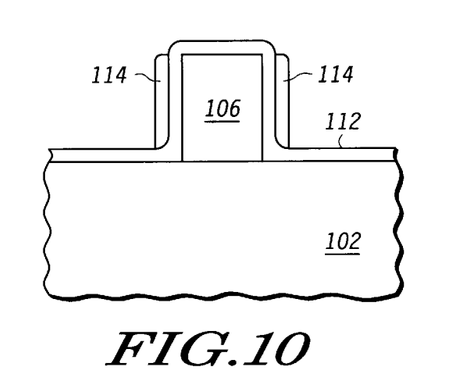
FIG. 10 illustrates processing subsequent to FIG. 9 in which dielectric spacers are formed on the crystallized silicon.

Referring to FIG. 10, dielectric spacer structures 114 are formed on the sidewalls of film 112. Spacer structures 114 are preferably formed by depositing a conformal film such as LPCVD or PECVD silicon nitride over film 112 and thereafter performing an anisotropic etch process that is selective to silicon. The etch process removes portions of the deposited dielectric that are parallel to the underlying substrate while leaving the portions of the film on the sidewalls (vertical surfaces) 105 of stack 106 intact. The formation of spacer structures is well known in the field of semiconductor processing for applications such as providing an implant mask for regions in close proximity to a polysilicon gate structure during a source/drain implant to achieve lightly doped drain devices. Nitride is the preferred material for spacer structure 114 to enable selective oxidation in a subsequent process.

Figure 11:
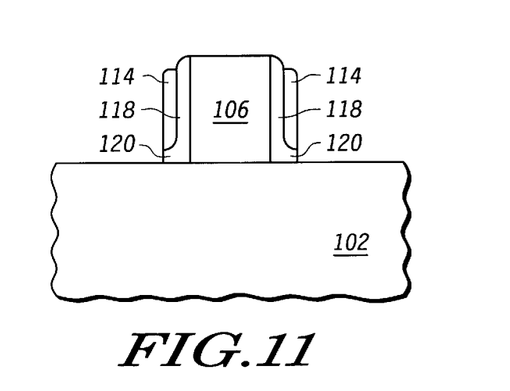
FIG. 11 illustrates processing subsequent to FIG. 10 in which exposed portions of the crystallized silicon are removed.

Referring now to FIG. 11, a silicon etch is performed following the formation of spacer structures 114 to remove portions of film 112 not protected by spacer structures 114. The portions of film 112 remaining after the silicon etch are referred to herein as silicon channel structure(s) or silicon wall(s) 118. As viewed in cross-section, channel structure 118 has the appearance of a pair of walls disposed on either side of dielectric structure 106. It should be appreciated, however, that channel structure 118 may include a single annular ring surrounding dielectric structure 106. Alternatively, channel structure 118 may be implemented as a straight wall. Channel structure 118 as shown includes exposed portions 120 (i.e., portions not covered by spacers 114) at the base of dielectric structure 106 in contact with or in very close proximity to substrate 102.

Figure 12:
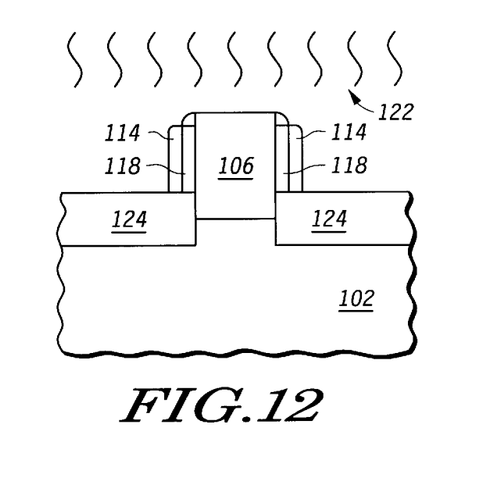
FIG. 12 illustrates subsequent processing in which exposed portions of the crystallized silicon are oxidized to isolate the crystallized silicon from the substrate.

Before channel structure 118 can serve as a channel region for a field effect transistor (FET), it must be isolated from the underlying substrate 102. This isolation can be achieved by selectively oxidizing exposed portions 120 of channel structure 118. Nitride spacer structures 114 enable this selective oxidation without oxidizing the silicon channel structures themselves. Referring to FIG. 12, the wafer is exposed to an oxygen-bearing ambient 122 maintained at a temperature in excess of approximately 600 degrees ° C. Ambient 122 oxidizes exposed portions 120 (FIG. 11) of channel structure 118 as well as an upper portion of substrate 102 to create a dielectric feature referred to herein as isolation oxide 124, which physically and electrically isolates channel structure 118 from substrate 102. Ambient 122 also oxidizes an upper portion of channel structure 118 thereby resulting in a residual oxide 125 at an upper portion of channel structure 118.

Figure 13:
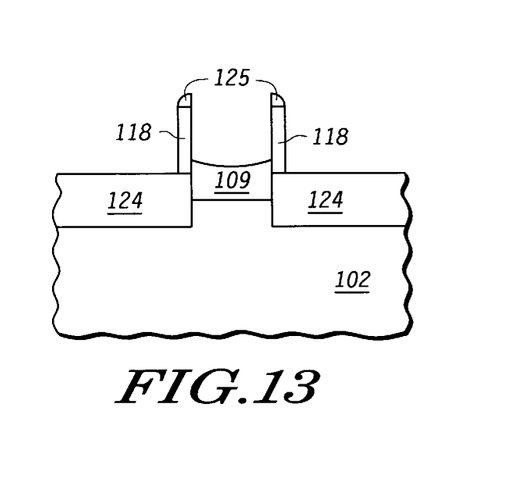
FIG. 13 illustrates subsequent processing in which the dielectric spacer is removed to reveal the silicon wall.

Referring now to FIG. 13, spacer structures 114 and dielectric structure 106 (or portions thereof) of FIG. 12 have been removed with conventional oxide or nitride dry etch processes. As depicted in FIG. 13, a remaining or residual portion of stack 106 is identified by reference numeral 109. If dielectric structure 106 and spacers 114 include silicon nitride, an $NF_4$—$O_2$ etch ambient may be used. If stack 106 includes an oxide, a conventional $CF_4$—$O_2$ oxide etch may be used. The removal of dielectric structure 106 and spacer structures 114 exposes a silicon wall 118 that is comprised of substantially monocrystalline silicon and that is isolated from and extends substantially perpendicularly from an upper surface of substrate 102. Silicon wall 118 may have a height of approximately 500 to 1000 angstroms and a thickness of approximately 50 to 500 angstroms depending upon the desired dimensions of the transistor to be formed with the wall.

Figure 14:
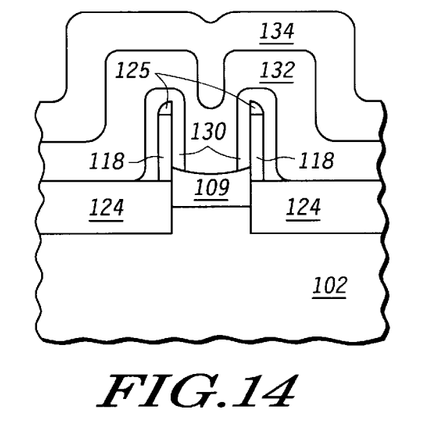
FIG. 14 illustrates subsequent processing in which a gate dielectric, gate electrode film, and capping layer are formed over the silicon wall.

Following the formation of silicon wall 118, a sequence of processing steps are performed to form a gate dielectric film, deposit a gate electrode film over the gate dielectric, and cap the gate electrode film. The cumulative effect of these processing steps is shown in FIG. 14. Initially, a gate dielectric film 130 is formed in contact with multiple surfaces of wall 118. Gate dielectric film 130 may include a thermally formed silicon dioxide film fabricated according to well-known transistor fabrication techniques and having a thickness in the range of approximately 10 to 60 angstroms. Alternatively, gate dielectric film 130 may include one or more CVD "high-K" dielectric films, each characterized by a dielectric constant greater than that of $SiO_2$. Such high-K materials include metal-oxide compounds such as $TiO_2$ and $Ta_2O_5$. Gate dielectric film 130 may also comprise thermally formed or deposited silicon-oxide in combination with one or more high-K films.

After gate dielectric film 130 is formed, a gate electrode film 132 is deposited over gate dielectric film 130. Gate electrode film 132 may include a conductive polysilicon film having a thickness of approximately 1000 anstroms. Alternatively, film 132 may include a metal, e.g., a refractory metal material such as titanium or tungsten or a combination of polysilicon, a refractory metal, or other metals. Gate electrode film 132, as its name implies, is an electrically conductive film that acts as the gate electrode for a FET transistor. When bias is applied to the gate electrode, a resulting electric field attracts carriers to the opposing surface of the gate dielectric film thereby creating an electrically conductive channel region at the interface between gate electrode film 132 and channel structure 118.

It is desirable to cap gate electrode film 132 with a protective or capping layer 134 to prevent unwanted alteration of the electrode layer 132 during subsequent processing. More specifically, it may be desirable to cap electrode layer 132 with a film that prevents or substantially reduces oxidation of electrode layer 132 during subsequent processing. Accordingly, one embodiment of the invention includes the deposition of an LPCVD or PECVD silicon nitride as capping layer 134. In this embodiment, capping layer 134 has a thickness of approximately 400 angstroms.

Figure 15:
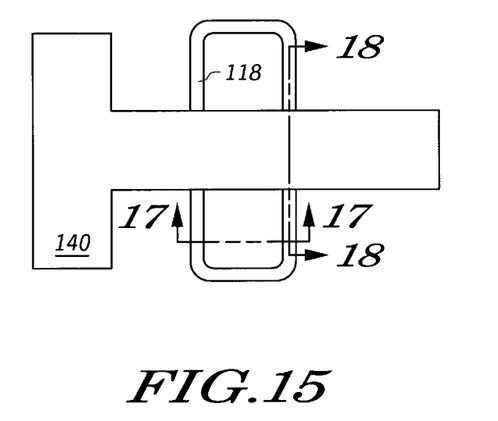
FIG. 15 is a top view illustrating processing subsequent to FIG. 14.
Figure 16:
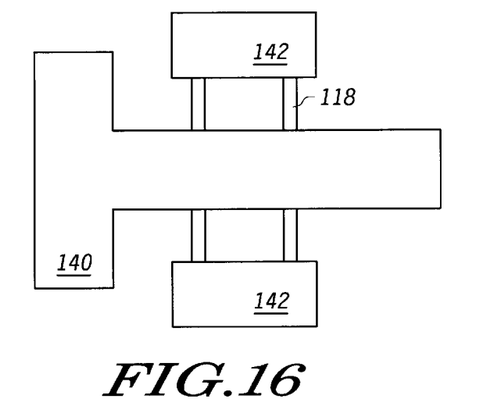
FIG. 16 is a top view illustrating processing subsequent to FIG. 14 according to an alternative embodiment.
Figure 17:
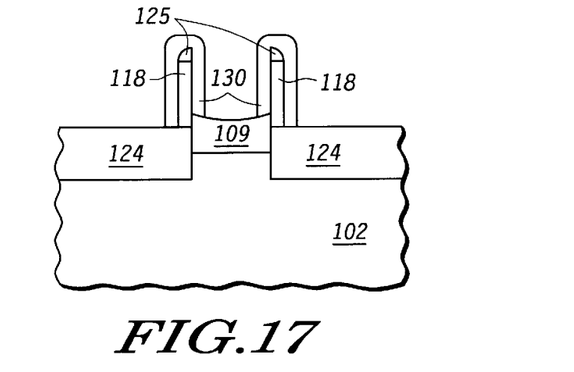
FIG. 17 is a cross sectional View taken along line 17—17 of FIG. 15 prior to source/drain implant processing.

Referring now to FIGS. 15 through 17, the gate electrode film 132 of FIG. 14 is patterned using conventional lithographic processing to form a gate electrode 140. FIGS. 15 and 16 depict top views of two alternative embodiments after this lithographic processing is complete. In FIG. 15, the only portion of the gate electrode layer remaining after etch is the portion of the layer that defines gate electrode 140. In an alternative embodiment depicted in FIG. 16, the gate electrode film is patterned to define, in addition to gate electrode 140, source/drain structures 142 that will facilitate formation of the source/drain regions during subsequent processing. FIG. 17 is a cross sectional view of the wafer taken along the line 17—17 of FIG. 15. Comparison of the cross sectional views of FIG. 14 and FIG. 17 reveals that, where gate electrode film 132 remains (FIG. 14), silicon wall 118 is covered by gate dielectric film 130, gate electrode film 132, and capping layer 134. In remaining areas of the wafer (e.g., FIG. 17), the patterning of gate electrode film 132 removes gate electrode film 132 and capping layer 134 from silicon wall 118 thereby exposing at least portions of silicon wall 118 (and the gate dielectric film 130 formed thereon).

Figure 18:
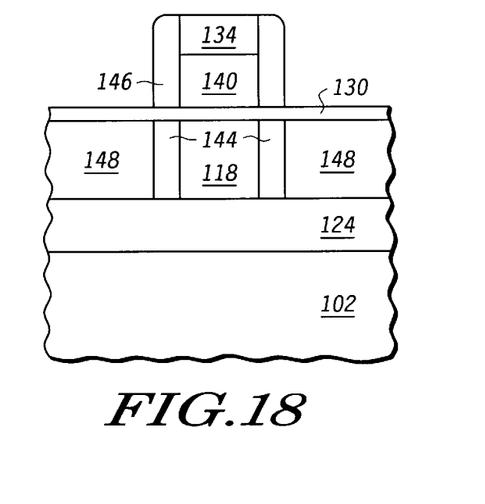
FIG. 18 is a cross sectional view taken along line 18—18 of FIG. 15 after source/drain implant processing.

Referring now to FIG. 18, which is a cross-section view taken along line 18—18 of FIG. 15, a source/drain implant sequence is preferably performed following the formation of gate electrode 140. This implant sequence may produce, for example, an extension (LDD) implant region 144 by implanting a relatively low dose (i.e., less than approximately $10^{16}$ atoms/cm$^3$) of an impurity such as arsenic, phosphorous, boron, or antimony is introduced into the regions of silicon wall 118 not masked (covered) by gate electrode 140. Following this first implant, dielectric spacers 146 may be formed on sidewalls of gate electrode 140 and a relatively high dose (i.e., more than $10^{18}$ atoms/cm$^3$) source/drain impurity region 148 implanted into silicon wall 118 in a manner that will be familiar to those in the field of semiconductor fabrication.

Dielectric spacers 146 are preferably nitride spacers. Because spacers 146 effectively cap portions of electrode 140 that were exposed following the etch of gate electrode film 132, spacers 146 provide, in addition to a mask for a high-dose source/drain implant, a second capping layer for electrode 140. In an alternative embodiment, the source/drain implant sequence is performed without the use of space structures using an angled implant and controlling the implant energy and doses appropriately to form LDD implant regions 144 and source/drain implant regions 148. In this embodiment, the formation of the second capping layer (spacers 146) may be performed after the source/drain implant sequence is completed.

Figure 19:
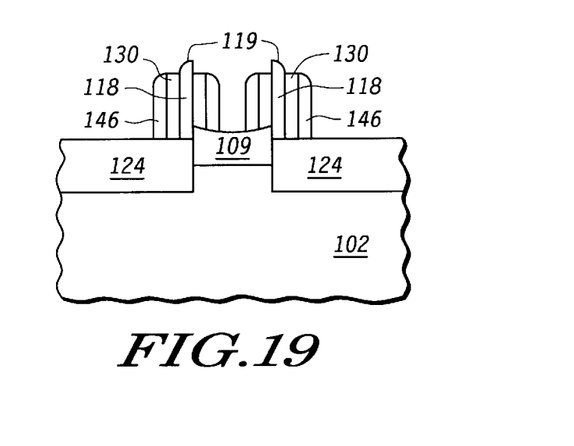
FIGS. 19 and 20 are cross sectional views taken along lines 17—17 and 18—18 respectively of FIG. 15 illustrating processing subsequent to FIG. 18.

The formation of dielectric spacers 146 using a blanket deposition followed by an anisotropic etch simultaneously forms spacer structures 146 on the sidewalls of silicon walls 118 (separated from silicon walls 118 by the intervening gate dielectric 130) as shown in FIG. 19.

Figure 20:
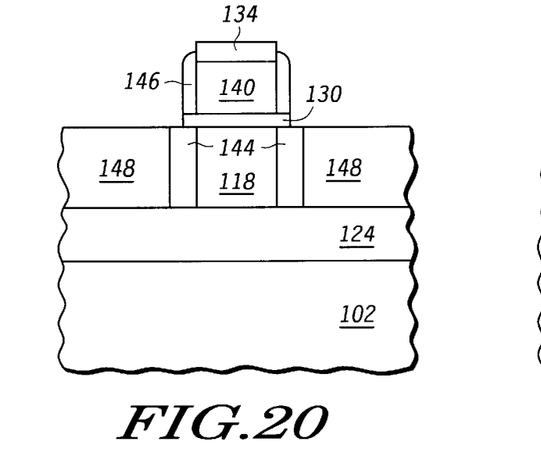

Referring now to FIGS. 19 and 20, cross-sectional views taken along lines 17—17 and 18—18 of FIG. 15, respectively, illustrate processing subsequent to FIG. 17 and FIG. 18 to prepare source/drain regions of silicon wall 118 for subsequent processing. The source/drain regions of silicon wall 118 refer to those portions of silicon wall 118 not masked (covered) by gate electrode 140 (see FIG. 15). After the source/drain implant sequence is completed, portions of gate dielectric film 130 (and any residual oxide 125) on the source/drain regions of silicon wall 118 are removed with an HF dip or other suitable oxide etch process to expose upper portions 119 of the source/drain regions of silicon wall 118. Depending upon the extent to which dielectric spacers 146 are etched prior to the high-dose source/drain implant of FIG. 18, it may be necessary to remove additional portions of spacers 146 to expose portions of gate dielectric 130 prior to the HF dip (or other oxide etch). In one embodiment, the pre-implant spacer etch terminates before exposing any portion of gate dielectric film 130 on the sidewalls of silicon wall 118. In this embodiment, additional over-etching of dielectric spacers 146 may be performed following source/drain implant to expose desired portions of gate dielectric 130. Alternatively, dielectric spacer 146 may be over-etched sufficiently prior to implant to expose upper portions of gate dielectric film 130. In this case, additional etching of spacer 146 following source/drain implant may not be necessary.

In FIGS. 19 and 20 cross-sectional views are shown following the HF dip (or equivalent gate dielectric removal process). The over-etching of dielectric spacers 146 has reduced the thickness of capping layer 134 and spacers 146 while the HF dip (or equivalent) has removed exposed portions of dielectric film 130 and any residual oxide 125 to expose upper portion 119 of silicon wall 118.

FIG. 20 illustrates the first capping layer 134 and dielectric spacers 146 encapsulating gate electrode 140. First capping layer 134 caps an upper surface of gate electrode 140 while spacers 146 cap sidewall portions of gate electrode 140. The encapsulation of gate electrode 140 achieves multiple desirable results. In addition to preventing subsequent processing of gate electrode 140 the dielectric or insulating capping layers prevent the formation of a conductive path or short circuit between gate electrode 140 and subsequently formed source/drain structures.

As illustrated in FIG. 19, upper portions 119 of silicon wall 118 not covered by dielectric spacers 146 are left exposed following the removal of gate dielectric 130. In one embodiment, an epitaxial process is performed to "grow" these exposed portions of silicon wall 118 thereby creating silicon source/drain structures 150 (depicted from a top view in FIG. 22 and in cross-sectional view of FIG. 23) having a size that is sufficient on which to form a conventional contact.

In an embodiment in which the gate electrode mask includes source/drain structures 142 (e.g., FIG. 16), the epitaxial formation of structures 150 may be eliminated. In this embodiment, subsequent source/drain contact processing may include a conventional silicide step that connects structures 142 with source/drain regions of silicon wall 118.

Figure 21:
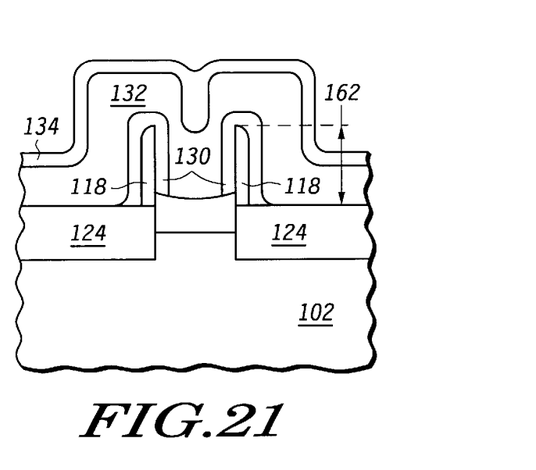
FIGS. 21 through 23 illustrate a top view and cross sectional views of a multiple gate transistor according to an embodiment of the present invention.
Figure 22:
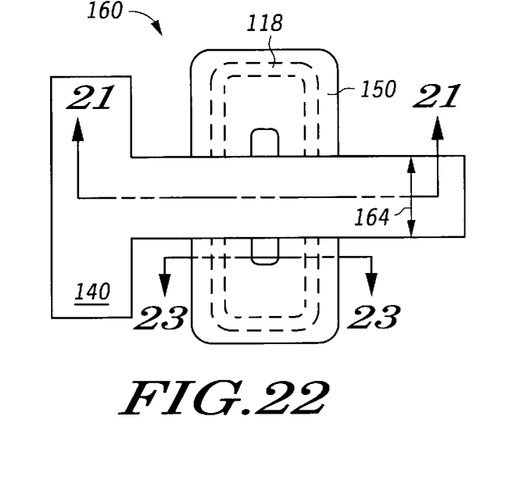
Figure 23:
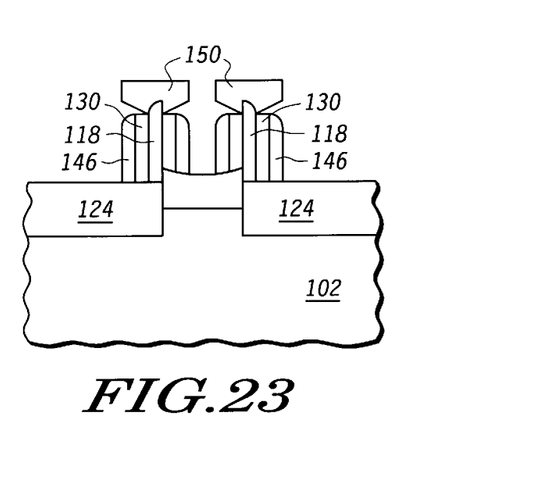

The formation of source/drain structures 150 substantially completes a transistor formation process according to the present invention. Conventional "back end" processing is then performed to interconnect the fabricated transistors in a manner dictated by the design of the intended integrated circuit. As depicted in FIGS. 21 through 23, the embodiment of the process described herein is suitable for fabricating a multiple gate transistor 160 and an integrated circuit comprising a plurality of interconnected such transistors. The depicted embodiment of transistor 160 includes a silicon wall 118 that extends perpendicularly from the wafer surface. Wall 118 is a substantially monocrystalline silicon structure that serves as the channel region for transistor 160.

Wall 118 is physically and electrically isolated from wafer substrate 102 such as by a dielectric 124 that is intermediate between a base of wall 118 and substrate 102. A gate dielectric 130 is "draped" over wall 118 such that both vertically oriented faces of wall 118 (as well as its horizontal upper surface) are in contact with dielectric 130 while a gate electrode 140 is formed over dielectric 130. In this manner, transistor 160 includes a multiple gate structure in which a bias applied to gate electrode 140 may induce at least two channels, a first channel at a first vertically oriented surface of wall 118 and a second channel at a second vertically oriented surface of wall 118. In this embodiment, the height 162 of wall 118 defines the width (W) of the transistor channel while a lateral dimension 164 of gate electrode 140 defines channel length (L).

Thus it will apparent to those skilled in the art having the benefit of this disclosure that there has been provided, in accordance with the invention, a process for fabricating a multiple-gate field effect transistor that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

What is claimed is:

1. A semiconductor fabrication method, comprising:
   forming a dielectric structure over a substrate;
   depositing a semiconductor material as a conformal film over the dielectric structure and substrate;
   processing the semiconductor material to form a substantially monocrystalline material;
   removing a portion of the monocrystalline material to form a channel structure;
   isolating the channel structure from the substrate; and
   forming a transistor having the channel structure as its channel wherein the transistor includes a gate dielectric in contact with the channel structure and a gate electrode in contact with the gate dielectric.

2. The method of claim 1, wherein removing portions of the semiconductor material comprises:
   depositing a dielectric film over the semiconductor material;
   etching the dielectric film anisotropically to form dielectric spacers on vertically oriented surfaces of the semiconductor material and to expose remaining portions of the semiconductor material; and
   etching the exposed portions of the semiconductor material wherein the channel structure comprises portions of the semiconductor material on sidewalls of the dielectric structure.

3. The method of claim 2, wherein isolating the channel structure comprises oxidizing a base portion of the channel structure.

4. A semiconductor fabrication method, comprising:
   depositing amorphous silicon over a crystalline silicon substrate;
   processing the amorphous silicon to form a substantially monocrystalline material;
   removing a portion of the monocrystalline material to form a channel structure;
   isolating the channel structure from the substrate; and
   forming a transistor having the channel structure as its channel wherein the transistor includes a gate dielectric in contact with the channel structure and a gate electrode in contact with the gate dielectric.

5. The method of claim 4, wherein processing the amorphous silicon comprises laser annealing the amorphous silicon.

6. The method of claim 4, wherein processing the amorphous silicon comprises exposing the amorphous silicon to a furnace maintained at a temperature in excess of 500° C.

7. A semiconductor fabrication method, comprising:
   depositing a semiconductor material over a substrate;
   processing the semiconductor material to form a substantially monocrystalline material, wherein the monocrystalline material includes vertically oriented portions and remaining portions;
   removing the remaining portions such that the channel structure is oriented substantially perpendicularly with respect to the substrate;
   isolating the channel structure from the substrate; and
   forming a transistor having the channel structure as its channel wherein the transistor includes a gate dielectric in contact with the channel structure and a gate electrode in contact with the gate dielectric.

8. The method of claim 7, wherein forming the transistor comprises forming a transistor gate adjacent at least two surfaces of the channel structure.

9. The method of claim 8, wherein forming the transistor gate comprises:
   forming a gate dielectric film over at least two surfaces of the monocrystalline material; and
   depositing a gate electrode film over the gate dielectric film.

10. A method fabricating an integrated circuit, comprising:
    forming a dielectric structure over a substrate, the dielectric structure having sidewalls oriented substantially vertically with respect to an upper surface of the substrate;
    depositing a semiconductor material over the dielectric structure and the substrate;
    removing portions of the semiconductor material other than portions along the dielectric structure sidewalls;
    isolating the wall from the substrate;
    forming a transistor gate adjacent at least two surfaces of the wall; and
    forming source/drain electrodes contacting portions of the wall disposed on either side of the transistor gate.

11. The method of claim 10, wherein depositing the semiconductor material over the dielectric structure comprises:
    depositing amorphous silicon where at least a portion of the amorphous silicon contacts the substrate; and
    crystallizing the amorphous silicon by a method selected from exposing the silicon to a furnace maintained in excess of 500° C. and laser annealing the amorphous silicon.

12. The method of claim 11, wherein removing portions of the semiconductor material comprises:

depositing a dielectric film over the semiconductor material;

etching the dielectric film anisotropically to expose portions of the semiconductor material not along the dielectric structure sidewalls; and etching the exposed portions of the semiconductor material.

13. The method of claim 12, wherein etching the dielectric film and etching the exposed portions of the semiconductor material leave a base portion of the semiconductor material exposed and wherein isolating the wall from the substrate comprises thermally oxidizing the exposed base portion of the semiconductor material.

14. The method of claim 12, wherein forming the dielectric structure comprises forming a film comprising a material selected from silicon-oxide and silicon-nitride.

15. The method of claim 12, wherein forming the transistor gate comprises:

forming a gate dielectric over at least two surfaces of the wall;

depositing a conductive gate electrode film over the gate dielectric; and patterning the gate electrode film.

16. The method of claim 15, further comprising depositing silicon nitride over the gate electrode film to form a capping layer.

17. The method of claim 15, wherein fonming the gate dielectric comprises thermally oxidizing at least two surfaces of the wall.

18. A method fabricating an integrated circuit, comprising:

forming a wall of substantially monocrystalline silicon over a surface of a substrate;

isolating the wall from the substrate;

forming a transistor gate adjacent at least two surfaces of the wall; and forming source/drain electrodes contacting portions of the wall disposed on either side of the transistor gate by removing a dielectric from at least a portion of the wall and growing an epitaxial silicon-bearing material on source/drain portions of the wall from which the dielectric has been removed.

19. A method of fabricating a transistor suitable for use in an integrated circuit, comprising:

forming a silicon wall over a surface of a monocrystalline silicon substrate, wherein vertical surfaces of the wall are substantially perpendicular to an upper surface of the substrate wherein forming the silicon wall comprises;

forming a dielectric structure having sidewalls;

depositing an amorphous silicon film over the dielectric structure and the substrate;

processing the amorphous silicon film to produce crystallized film that is substantially monocrystalline;

forming spacers on sidewalls of the crystallized film; and etching portions of the crystallized film exposed by the spacers;

forming a gate dielectric film in contact with at least two surfaces of the silicon wall;

forming a gate electrode over the gate dielectric film, wherein the gate electrode is adjacent at least two surfaces of the wall; and forming source/drain electrodes in contact with portions of the wall disposed on either side of the gate electrode.

* * * * *

UNITED STATES PATENT AND TRADEMARK OFFICE
CERTIFICATE OF CORRECTION

PATENT NO. : 6,753,216 B2 Page 1 of 1
DATED : June 22, 2004
INVENTOR(S) : Leo Mathew et al.

It is certified that error appears in the above-identified patent and that said Letters Patent is hereby corrected as shown below:

Column 11,
Line 29, change "fonming" to -- forming --.

Signed and Sealed this

Second Day of May, 2006

JON W. DUDAS
*Director of the United States Patent and Trademark Office*